(12) United States Patent
Ito et al.

(10) Patent No.: US 7,793,197 B2
(45) Date of Patent: Sep. 7, 2010

(54) ERROR CORRECTION APPARATUS

(75) Inventors: Toshio Ito, Kawasaki (JP); Toshihiko Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1049 days.

(21) Appl. No.: 11/509,282

(22) Filed: Aug. 24, 2006

(65) Prior Publication Data

US 2007/0245220 A1      Oct. 18, 2007

(30) Foreign Application Priority Data

Mar. 30, 2006    (JP) ............................. 2006-096049

(51) Int. Cl.
   *H03M 13/00*    (2006.01)
(52) U.S. Cl. .................. 714/784; 714/798; 714/785
(58) Field of Classification Search ................ 714/784, 714/785, 798, 799, 801, 805, 788
   See application file for complete search history.

(56) References Cited

U.S. PATENT DOCUMENTS

| | | | | |
|---|---|---|---|---|
| 4,897,839 | A | * | 1/1990 | Yamagishi et al. .......... 714/785 |
| 5,508,742 | A | * | 4/1996 | Geerlings et al. ........... 348/279 |
| 5,563,896 | A | * | 10/1996 | Nakaguchi .................. 714/785 |
| 5,942,005 | A | * | 8/1999 | Hassner et al. .............. 714/784 |
| 7,107,510 | B2 | * | 9/2006 | Katoh et al. ................. 714/785 |
| 2003/0106014 | A1 | | 6/2003 | Dohmen et al. |

FOREIGN PATENT DOCUMENTS

| | | |
|---|---|---|
| EP | 1 102 406 | 5/2001 |
| WO | WO 95/24769 | 9/1995 |
| WO | WO 97/00559 | 1/1997 |

OTHER PUBLICATIONS

H. Imai; "Coding Theory"; IEICE, pp. 155-175; Mar. 1990.
E.R. Berlekamp; "Binary BCH Codes for Correcting Multiple Errors"; Algebraic Coding Theory, McGraw-Hill Book Co., pp. 176-199; 1968.
E.R. Berlekamp; "Gorenstein-Zierler Generalized Nonbinary BCH Codes for the Hamming Metric"; Algebraic Coding Theory, McGraw-Hill Book Co., pp. 218-240; 1968.
J.L. Massey; "Shift-Register Synthesis and BCH Decoding"; IEEE Trans. on Information Theory; vol. IT-15, No. 1; pp. 122-127; Jan. 1969.
The State Intellectual Property Office of China; Office Action; Filing No. of Patent Appln. 200610153814.4; Date of Issue: Apr. 17, 2009.

* cited by examiner

*Primary Examiner*—Fritz Alphonse
(74) *Attorney, Agent, or Firm*—Greer, Burns & Crain, Ltd.

(57) ABSTRACT

One set of syndromes is calculated from a first data string from among a plurality thereof including at least 2t+1 pieces of symbols as a parity string, and coefficients of an error locator polynomial from the one set of the syndromes. Whether or not a correction is successful is judged by using the coefficients of the error locator polynomial and the same calculation is performed for a second data string if a correction failure is judged. Contrarily, if a correction success is judged, an error of the first data string is corrected by using the aforementioned set of the syndromes and the coefficients of the error locator polynomial.

7 Claims, 20 Drawing Sheets

RELATED ART
F I G. 1D

| j | 4 | 3 | 2 | | 1 | 0 |
|---|---|---|---|---|---|---|
| BIT EXPRESSION | 001 | 110 | 101 | | | |
| GALOIS FIELD EXPRESSION | 1 | $\alpha^5$ | $\alpha^4$ | | | |

INFORMATION STRING

PARITY STRING $$x^2 + \alpha^3 x + \alpha \overline{\smash{\big)}\begin{array}{l} x^2 + \alpha^2 x + \alpha^3 \\ x^4 + \alpha^5 x^3 + \alpha^2 \end{array}}$$

$$\overline{\alpha^4 x + \alpha^4}$$

RELATED ART
F I G. 1 E

| | INFORMATION STRING | | PARITY STRING | |
|---|---|---|---|---|
| GALOIS FIELD EXPRESSION | 1 | $\alpha^5$ | $\alpha^4$ | $\alpha^4$ | $\alpha^4$ |
| BIT EXPRESSION | 001 | 110 | 101 | 101 | 101 |

RELATED ART
FIG. 1F

| j | 4 | 3 | 2 | 1 | 0 |
|---|---|---|---|---|---|
| TRANSMISSION WORD STRING : F | 1 | $\alpha^5$ | $\alpha^4$ | $\alpha^4$ | $\alpha^4$ |
| RECEPTION WORD STRING : Y | $\alpha$ | $\alpha^5$ | $\alpha^4$ | $\alpha^4$ | $\alpha^4$ |
| POSITION INFORMATION | $\alpha^4$ | $\alpha^3$ | $\alpha^2$ | $\alpha$ | 1 |

RELATED ART
FIG. 1G

| j | 4 | 3 | 2 | 1 | 0 |
|---|---|---|---|---|---|
|   | 1 | $\alpha^5$ | $\alpha^4$ | $\alpha^4$ | $\alpha^4$ |

RELATED ART
FIG. 1H

| ONE SECTOR | 40-S PARITY |
|---|---|

RELATED ART
FIG. 11

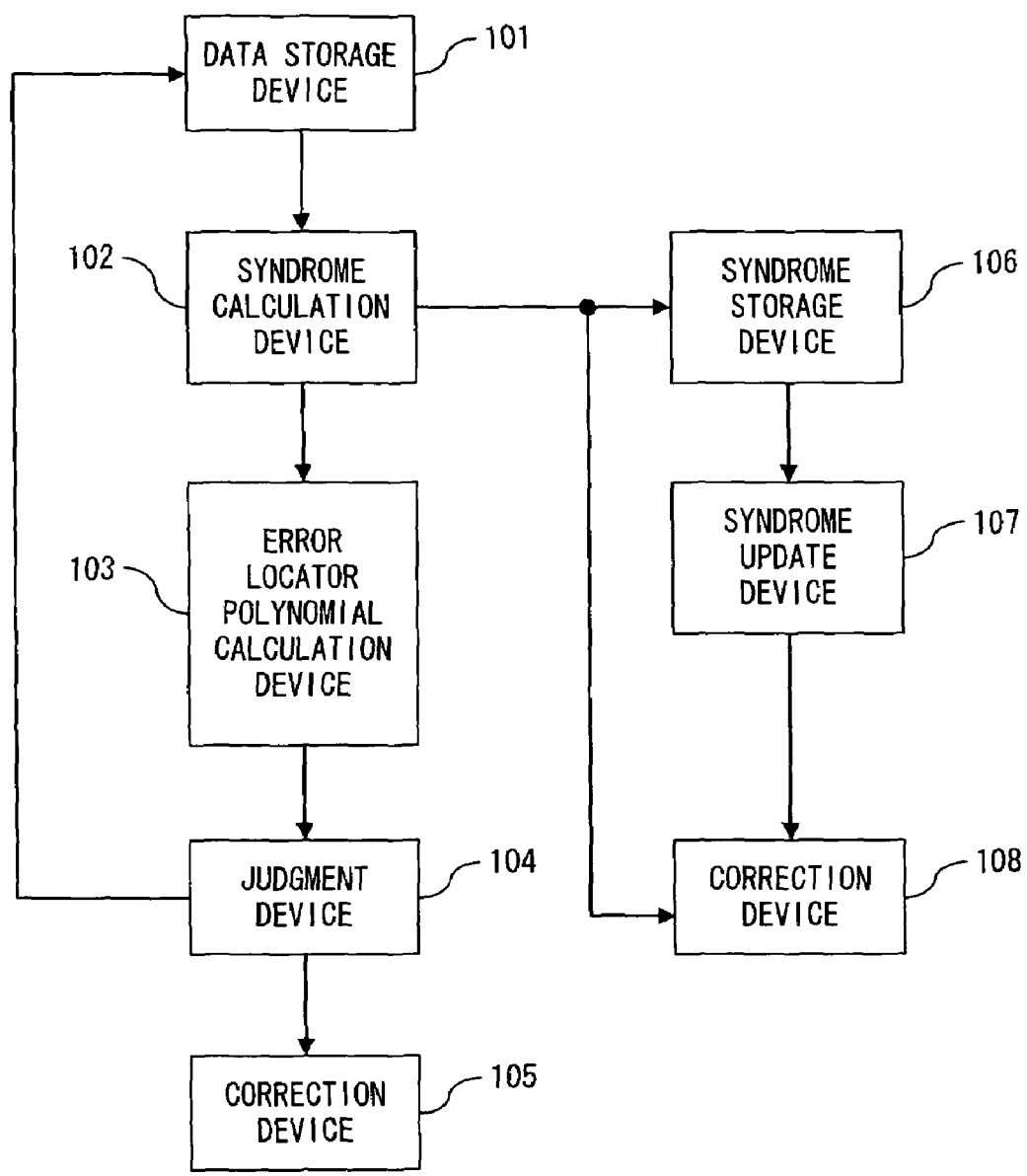
F I G. 2 A

| ONE SECTOR | 41-S PARITY |
|---|---|

F I G. 4

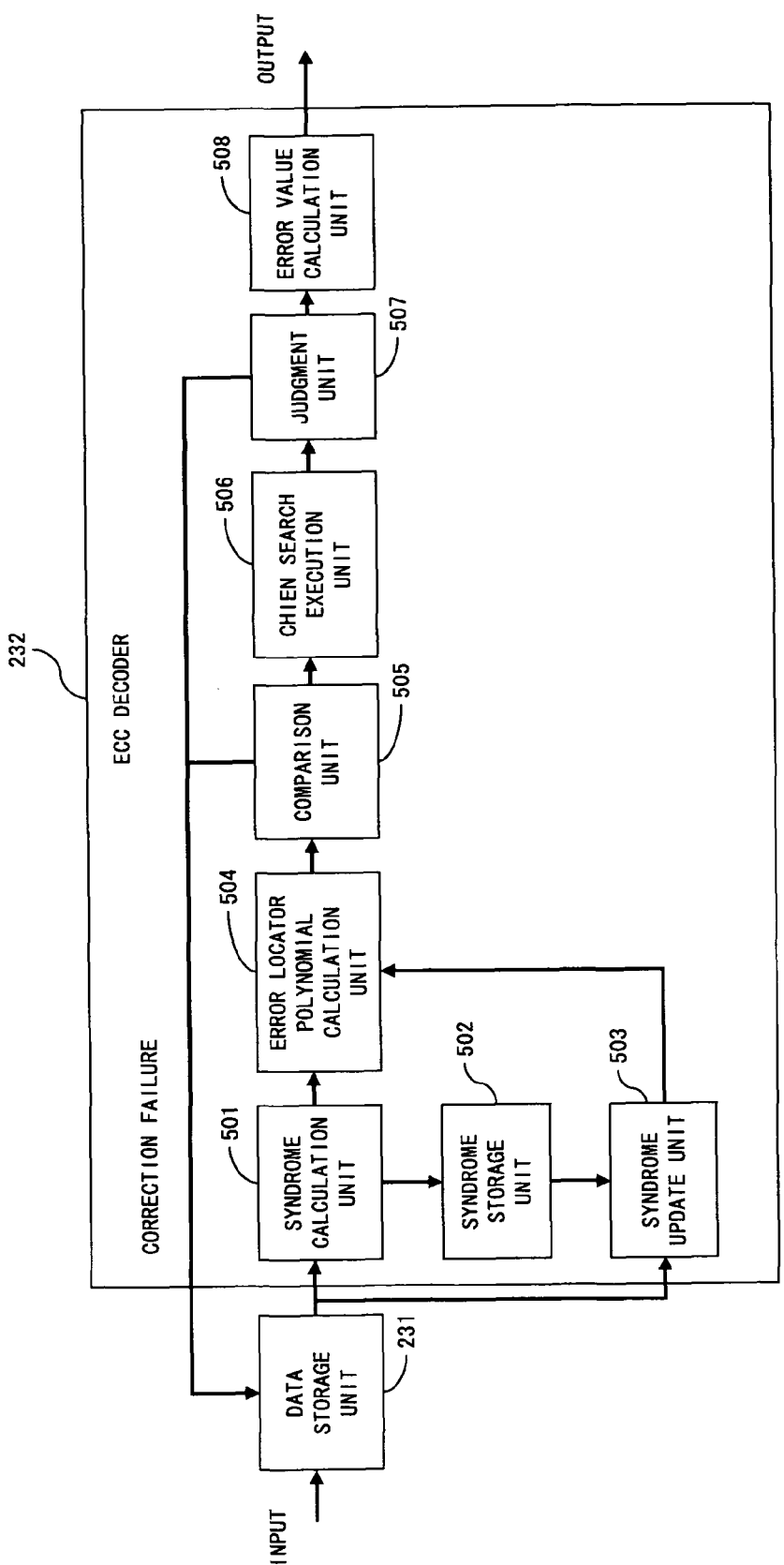
F I G. 5

| j | n | n−1 | ... | 1 | 0 |
|---|---|---|---|---|---|
| FIRST CANDIDATE | $\alpha^2$ | $\alpha^{22}$ | ... | $\alpha^{12}$ | $\alpha^5$ |
| CODING TARGET CANDIDATE | $\alpha^2$ | $\alpha^{22}$ | ... | $\alpha^6$ | $\alpha^5$ |

FIG. 6

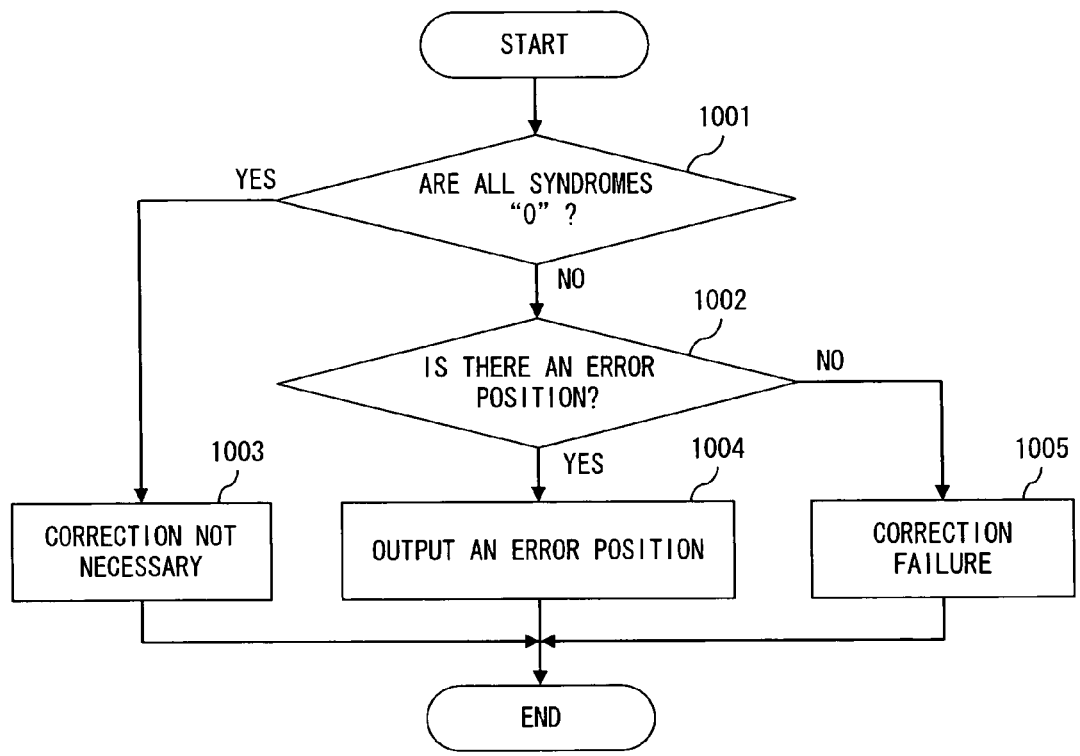
F I G. 1 0

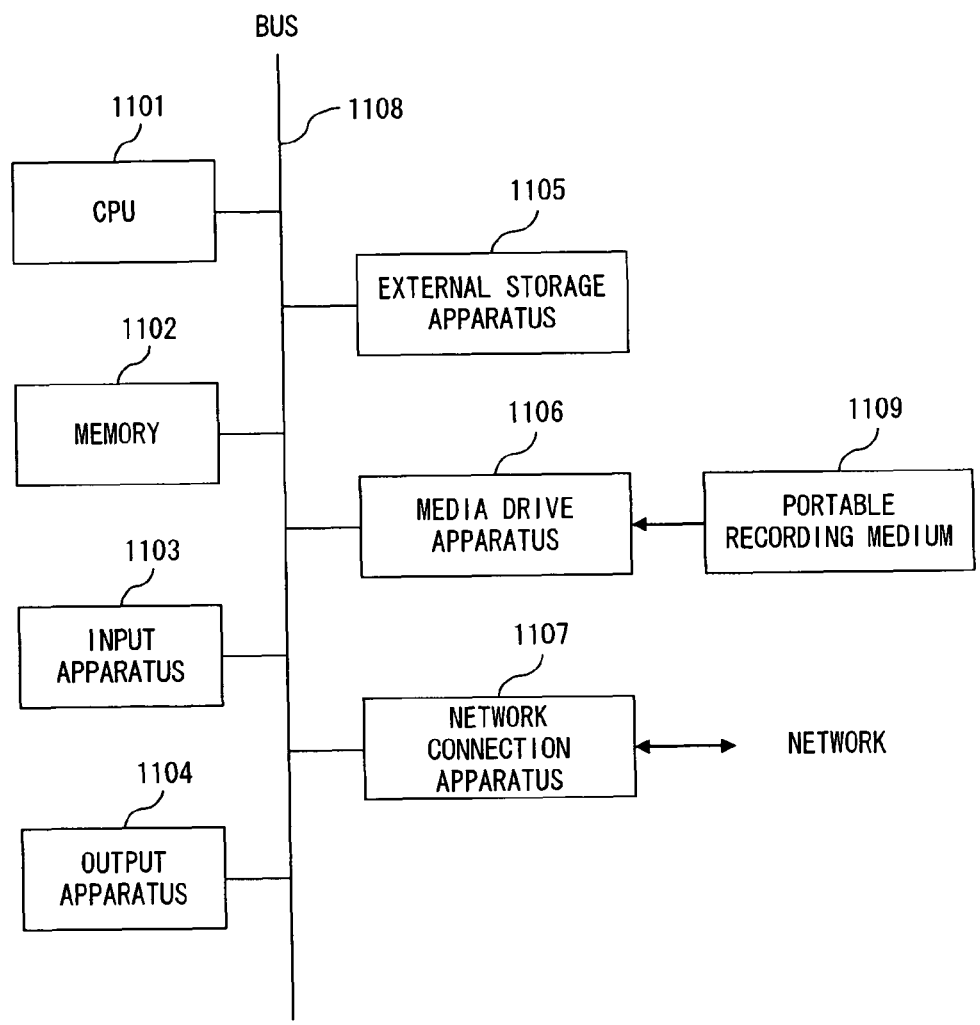
F I G. 1 1

ERROR CORRECTION APPARATUS

BACKGROUND OF THE INVENTION

1. Field of the Invention

The present invention relates to an error correction technique for use in a record reproduction apparatus, a reception apparatus, et cetera, and in particular to an apparatus correcting an error of a data string by using a Reed Solomon code.

2. Description of the Related Art

A Reed Solomon code (e.g., refer to the following non-patent document 1) is used as an error correction code (ECC) for a record reproduction apparatus, such as magnetic disk apparatus, and a telecommunication system.

Non-patent document 1: IMAI, Hideki, "Theory of Coding", edited by the Institute of Electronics, Information and Communication, pp. 155-175

In an error correction apparatus, a data string input to an ECC decoder is output from a detector. Usually, a single data string as a decoding candidate is input from a detector 11 to an ECC decoder 12 and a decoding is carried out as shown in FIG. 1A. In this case, if the decoding fails, an error cannot be corrected.

Consequently, there is a case of using an apparatus inputting a plurality of data strings to an ECC decoder 22 from a detector 21 as shown in FIG. 1B. In this case, the ECC decoder 22 decodes the respective data strings as candidates, thereby improving a correction capability.

FIG. 1C exemplifies a configuration of the ECC decoder 22 shown in FIG. 1B. The ECC decoder 22 comprises a syndrome calculation unit 41, an error locator polynomial calculation unit 42, a Chien search execution unit 43 and an error value calculation unit 44.

A plurality of data strings output from the detector 21 is once stored in a data storage unit 31, followed by being input to the ECC decoder 22 one by one, in which event it corrects an error included in the data string by the following procedure:

Step 1: the syndrome calculation unit 41 calculates a syndrome polynomial of the data string input to the ECC decoder 22.

Step 2: the error locator polynomial calculation unit 42 calculates an error locator polynomial from the syndrome polynomial. A calculation algorithm of the error locator polynomial uses a Euclid method or a Berlekamp Massey method for instance (e.g., refer to the following non-patent documents 2 and 3):

Non-patent document 2: E. R. Berlekamp, "Algebraic Coding Theory", McGraw-Hill Book Co., pp. 176-199 and pp. 218-240, New York, 1968

Non-patent document 3: J. L. Massey, "Shift-Register Synthesis and BCH Decoding", IEEE Transactions on Information Theory, vol. IT-15, pp. 122-127, 1969

Step 3: the Chien search execution unit 43 carries out a Chien search by using the error locator polynomial obtained in the step 2 and determines a position where an error exists on a data string (i.e., an error position).

Step 4: the error value calculation unit 44 corrects an error value at the error position to a correct value.

Then a decode judgment unit 32 checks validity of the corrected data string output from the error value calculation unit 44 and, if the judgment is "invalid", deciding a failed correction, and instructs the data storage unit 31 to output the next decoding candidate.

Here, a description of a concrete example of an error correction based on the Reed Solomon code by referring to FIGS. 1D through 1H.

A Reed Solomon code of the number of error corrections of t is generated from a generator polynomial of the degree of 2t. Letting a Galois field used for a coding be $GF(2^3)$ and the number of error corrections t be "1", and using a primitive element $\alpha$, then a generator polynomial of a Reed Solomon code can be expressed as follows, for example:

$$G(x) = (x-1)(x-\alpha) \quad (1)$$
$$= x^2 + \alpha^3 x + \alpha$$

In this case, a three-bit bit string is handled as one symbol, adding a parity string of 2t (=2) symbols to an information string at the ECC decoder. For example, in the case of coding a bit string as shown in FIG. 1D, "001", "110" and "101" correspond to 1, $\alpha^5$ and $\alpha^4$, respectively, in Galois field expressions. The j-th symbol represents the coefficient of a term of $x^j$ in the polynomial of a transmission word string. Therefore, this bit string represents a polynomial $x^4 + \alpha^5 x^3 + \alpha^4 x^2$.

The ECC decoder divides a polynomial represented by a bit string by the generator polynomial of the expression (1) as shown in FIG. 1E and adds a parity string representing the resultant remainder polynomial $\alpha^4 x + \alpha^4$ to the bit string. In this remainder polynomial, coefficients of terms of the first and zeroth order of x are both $\alpha^4$, and therefore the parity string as shown in FIG. 1F is added, thus a transmission word string constituted by five symbols being generated.

When this transmission word string is recorded in a magnetic disk and is read therefrom, a reception word string including an error may possibly be input to the ECC decoder 22 as shown in FIG. 1G. A reception word polynomial represented by the reception word string is as follows:

$$Y(x) = \alpha x^4 + \alpha^5 x^3 + \alpha^4 x^2 + \alpha^4 x + \alpha^4 \quad (2)$$

In this case, the syndrome calculation unit 41 calculates a syndrome polynomial by the following expressions:

$$S(x) = s_1 + s_2 x$$
$$s_1 = Y(1)$$
$$s_2 = Y(\alpha) \quad (3)$$

The syndrome $s_i$ (where i=1, 2, ..., 2t) is a value obtained by substituting the i-th root of a generator polynomial $G(x)$ for the reception word polynomial $Y(x)$, and the syndrome polynomial $S(x)$ is a polynomial having the syndrome $s_i$ as the coefficient of a term of $x^{i-1}$. If an error is not included in the reception word string, all of the $s_i$ becomes zero.

Then, the error locator polynomial calculation unit 42 calculates, from the syndrome polynomial $S(x)$, an error locator polynomial $C(x)$ as follows:

$$C(x) = 1 + \alpha^{-4} x \quad (4)$$

Then, the Chien search execution unit 43 calculates values of $C(\alpha^j)$ (where j=0, 1, 2, 3, 4) by using the error locator polynomial $C(x)$ and outputs a position j where the $C(\alpha^j)=0$ as an error position. In this example, as $C(\alpha^4)=1+\alpha^{-4}*\alpha^4=0$, it is found that the fourth symbol has an error.

Then, the error value calculation unit 44 calculates a correct value of the fourth symbol by a predetermined algorithm by using the syndrome polynomial $S(x)$ and error locator polynomial $C(x)$, and corrects the bit string. A correct value "1" is obtained in this event, and the fourth symbol in the reception word string is accordingly changed from $\alpha$ to "1" as shown in FIG. 1H.

A Reed Solomon code with t=20 is sometimes used for a magnetic disk, while in an ECC coder, a 40-symbol parity string is generated and inserted in front of one sector bit string as shown in FIG. 1I, in which case, the syndrome polynomial S(x) and error locator polynomial C(x) are for example as follows:

$$S(x)=s_1+s_2x+\ldots+s_{40}x^{39} \quad (5)$$

$$C(x)=1+x+\alpha^2x^2+\ldots+\alpha^{35}x^8 \quad (6)$$

The above described conventional ECC decoder is faced with the following problems:

An actual reception word string is far longer than five symbols, making the degree of a reception word polynomial Y(x) large. Consequently, the calculation of the syndrome polynomial S(x) and a calculation volume of a Chien search become enormous, thereby taking a long time for a decoding process.

Meanwhile, the configuration shown by FIG. 1C judges a success or failure of a decoding on the output side of the ECC decoder, and therefore a series of a decoding process is carried out even if a correction has failed due to a certain decoding candidate containing errors exceeding a correction capability of the ECC decoder, thus reducing efficiency. Accordingly desired is a method for judging, in earlier stage, whether or not a decoding of a candidate data string is failed and proceeding to a decoding of the next candidate quickly if a failure is discovered.

SUMMARY OF THE INVENTION

An object of the present invention is to reduce a calculation volume for a decoding process of a Reed Solomon code, thereby speeding up the process.

A first error correction apparatus according to the present invention, comprising a data storage device, a syndrome calculation device, an error locator polynomial calculation device, a judgment device and a correction device, corrects an error of a data string by using a Reed Solomon code or a Bose Chaudhuri Hocquenghem (BCH) code of the number of error corrections of t.

The data storage device stores a plurality of data strings respectively including at least 2t+1 pieces of symbols as a parity string. The syndrome calculation device calculates one set of syndromes from a first data string from among the plurality thereof. The error locator polynomial calculation device calculates coefficients of an error locator polynomial from the one set of the syndromes.

The judgment device judges whether or not a correction succeeds by using the coefficients of the error locator polynomial, and requests the data storage device for a second data string if the correction is judged to fail, while outputs the judgment result of a successful correction if the correction is judged to succeed. The correction device corrects an error of the first data string by using the one set of the syndromes and the coefficients of the error locator polynomial when receiving the judgment result of the successful correction.

A second error correction apparatus according to the present invention, comprising a data storage device, a syndrome calculation device, a syndrome storage device, a syndrome update device and a correction device, corrects an error of a data string by using a Reed Solomon code or a BCH code.

The data storage device stores a plurality of data strings. The syndrome calculation device calculates one set of syndromes from a first data string from among the plurality of data strings. The syndrome storage device stores the one set of the syndromes. The correction device corrects an error of the first data string by using the one set of the syndromes.

The syndrome update device calculates a difference of each syndrome from a difference between the first data string and a second data string, updates the one set of syndromes by adding the obtained difference to each syndrome included in the one set of syndromes and outputs the updated set of syndromes as one set thereof of the second data string when failing in a correction of the first data string.

BRIEF DESCRIPTION OF THE DRAWINGS

FIG. 2A is a diagram of a principle of an error correction apparatus according to the present invention;
FIG. 4 is a diagram showing a format of a transmission word string according to the present invention;
FIG. 5 is a configuration diagram of an ECC decoder according to the present invention;
FIG. 6 is a diagram showing a difference between a plurality decoding candidates;
FIG. 10 is a flow chart of a process at a judgment unit;
and
FIG. 11 is a configuration diagram of an information processing apparatus.

DESCRIPTION OF THE PREFERRED EMBODIMENTS

Figure 1:
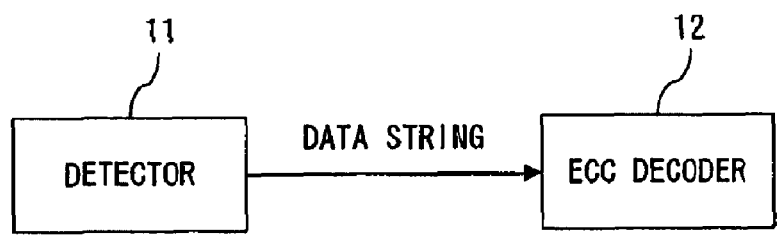
FIG. 1A is a diagram showing a single decoding candidate.
FIG. 1B is a diagram showing a plurality of decoding candidates.
FIG. 1C is a configuration diagram of a conventional ECC decoder.
FIG. 1D is a diagram showing an information string.
FIG. 1E is a diagram showing a parity generation arithmetic operation.
FIG. 1F is a diagram showing a transmission word string.
FIG. 1G is a diagram showing a reception word string including an error.
FIG. 1H is a diagram showing a corrected reception word string.
FIG. 1I is a diagram showing a format of a conventional transmission word string.
Figure 1B:
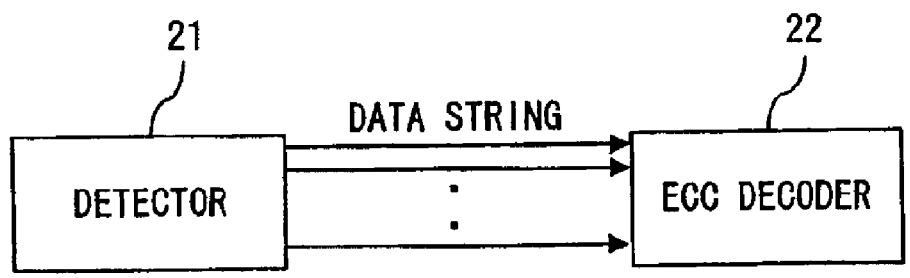
Figure 1C:
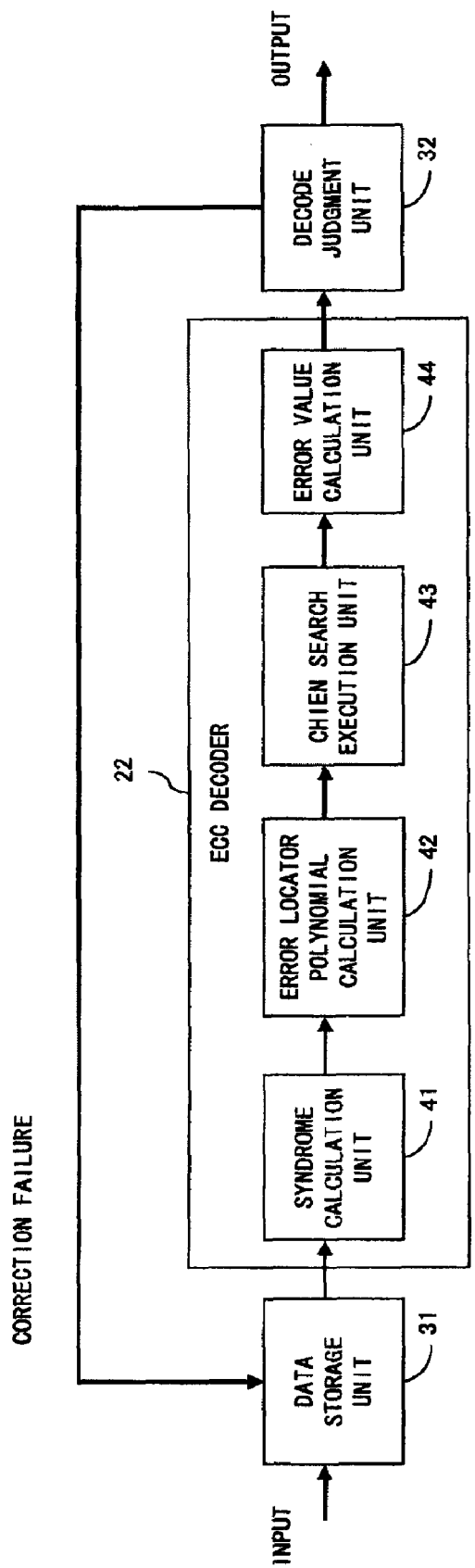

The following is a detailed description of the preferred embodiment of the present invention by referring to the accompanying drawings.

FIG. 2A is a diagram of a principle of a first and a second error correction apparatuses according to the present invention.

The first error correction apparatus according to the present invention, comprising a data storage device 101, a syndrome calculation device 102, an error locator polynomial calculation device 103, a judgment device 104 and a correction device 105, corrects an error of a data string by using a Reed Solomon code or a Bose Chaudhuri Hocquenghem (BCH) code of the number of error corrections of t.

The data storage device 101 stores a plurality of data strings respectively including at least 2t+1 pieces of symbols as a parity string. The syndrome calculation device 102 calculates one set of syndromes from a first data string from among the plurality thereof. The error locator polynomial calculation device 103 calculates coefficients of an error locator polynomial from the one set of the syndromes.

The judgment device 104 judges whether or not a correction succeeds by using the coefficients of the error locator polynomial, and requests the data storage device 101 for a second data string if the correction is judged to fail, while outputs the judgment result of a successful correction if the correction is judged to succeed. The correction device 105 corrects an error of the first data string by using the one set of the syndromes and the coefficients of the error locator polynomial when receiving the judgment result of the successful correction.

In general, a Reed Solomon code of the number of error corrections of t is capable of correcting up to t pieces of error symbols included in a data string by adding a parity string comprising 2t pieces of symbols based on the generator polynomial of the degree of 2t. Comparably, more addition of a parity of several symbols based on a generator polynomial of a higher degree increases a redundancy of the Reed Solomon code, and hence it is possible to calculate additional several pieces of syndromes.

For example, an addition of a parity string constituted by 2t+1 pieces of symbols based on a generator polynomial of the degree of 2t+1 makes is possible to calculate 2t+1 pieces of syndromes. A calculation of coefficients of an error locator polynomial from those syndromes makes it possible to judge a success or failure of correcting a data string during a decoding.

Then, if a correction failure is judged, a decoding process for the second data string is started instead of correcting the first data string, thereby making it possible to eliminate a useless Chien search, et cetera, for the first data string and reducing a calculation volume.

The second error correction apparatus according to the present invention, comprising a data storage device 101, a syndrome calculation device 102, a syndrome storage device 106, a syndrome update device 107 and a correction device 108, corrects an error of a data string by using a Reed Solomon code or a BCH code.

The data storage device 101 stores a plurality of data strings. The syndrome calculation device 102 calculates one set of syndromes from a first data string from among the plurality of data strings. The syndrome storage device 106 stores the one set of the syndromes. The correction device 108 corrects an error of the first data string by using the one set of the syndromes.

The syndrome update device 107 calculates a difference of each syndrome from a difference between the first data string and a second data string, updates the one set of syndromes by adding the obtained difference to each syndrome included in the one set of syndromes and outputs the updated set of syndromes as one set thereof of the second data string when failing in a correction of the first data string.

Generally, a syndrome is calculated by substituting a predetermined value for a polynomial represented by a data string, and therefore a calculation of only term corresponding to the difference between the first and second data strings makes it possible to calculate a difference of the syndrome.

Accordingly, when failing in a correction of the first data string, an addition of the difference to each syndrome of the already calculated first data string, instead of calculating each syndrome of the second data string anew, makes it possible to obtain each syndrome of the second data string. This configuration simplifies the calculation of the syndromes for the second data string and reduces the calculation volume.

The data storage device 101, syndrome calculation device 102, error locator polynomial calculation device 103, judgment device 104, syndrome storage device 106 and syndrome update device 107 correspond to a data storage unit 231, a syndrome calculation unit 501, an error locator polynomial calculation unit 504, a comparison unit 505, a syndrome storage unit 502 and a syndrome update unit 503, respectively, for example, which are described later in association with FIG. 5.

The correction device 105 corresponds to a Chien search execution unit 506, a judgment unit 507 and an error value calculation unit 508, for example, which are shown in FIG. 5, while the correction device 108 corresponds to the error locator polynomial calculation unit 504, comparison unit 505, Chien search execution unit 506, judgment unit 507 and error value calculation unit 508, for example, which are shown in FIG. 5.

The present invention is contrived to be capable of judging a success or failure of a correction of a data string during a decoding of a Reed Solomon code or a BCH code, thereby eliminating a useless Chien search, et cetera, in the case of a correction failure. It also makes it possible to greatly simplify a calculation of a syndrome for a data string of a coding candidate in the second place and thereafter, thereby altogether resulting in reducing the calculation volume and speeding up the decoding process.

Figure 2B:
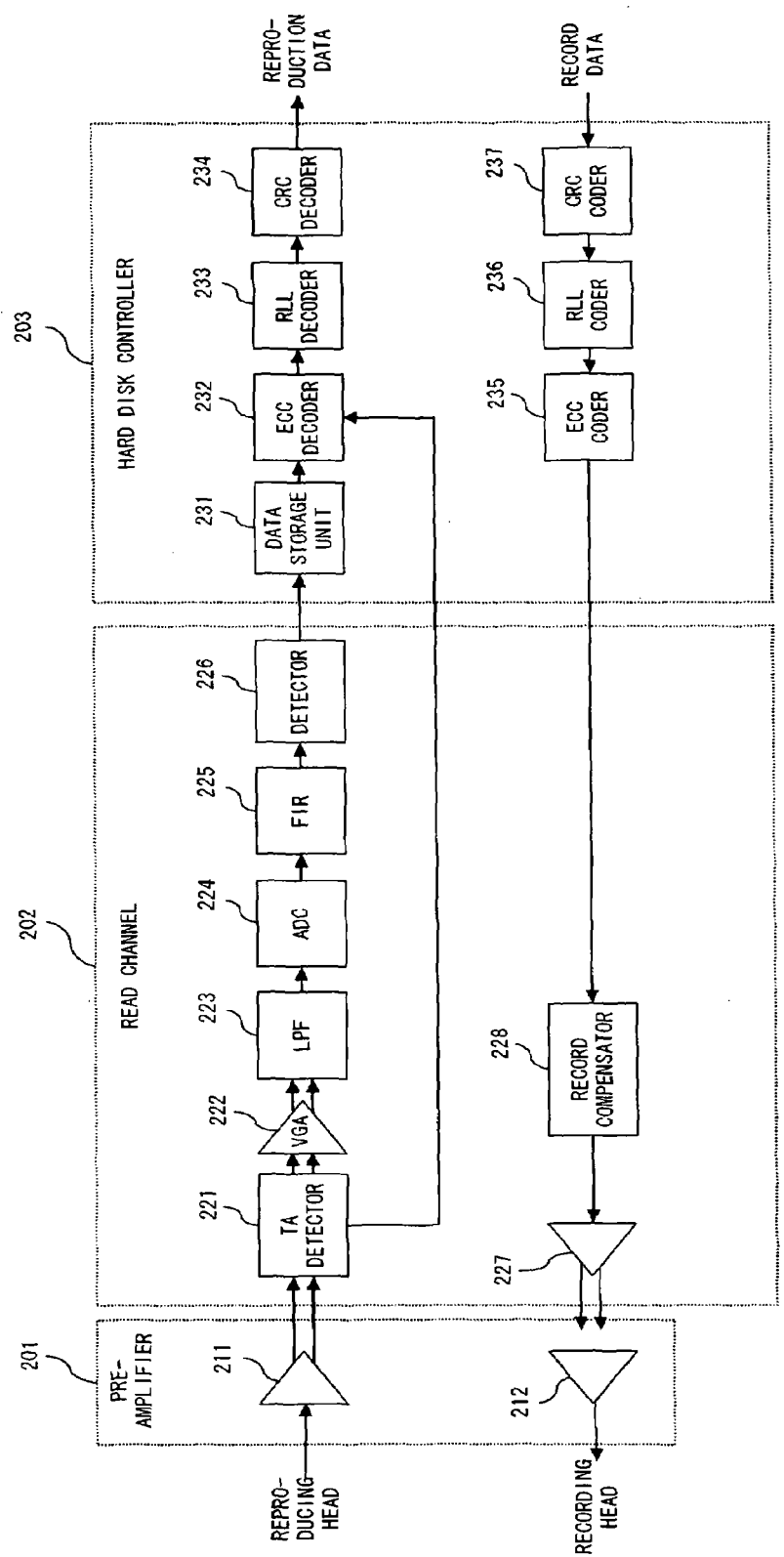
FIG. 2B is a configuration diagram of a record reproduction apparatus.

What follows here is a description of a preferred embodiment of an error correction process carried out at a magnetic disk apparatus as a representative example of a record reproduction apparatus. FIG. 2B exemplifies a configuration of a record reproduction system of a magnetic disk apparatus. The record reproduction system is constituted by a preamplifier 201, a read channel 202 and a hard disk controller 203.

The preamplifier 201 comprises an amplifier 211 and a driver 212. The read channel 202 comprises a thermal asperity (TA) detector 221, a variable gain amplifier (VGA) 222, a low pass filter (LPF) 223, an analog/digital converter (ADC) 224, a finite impulse response (FIR) filter 225, a detector 226, a driver 227 and a record compensator 228.

The hard disk controller 203 comprises a data storage unit 231, an ECC decoder 232, a run length limited (RLL) decoder 233, a cyclic redundancy check (CRC) decoder 234, an ECC coder 235, an RLL coder 236 and a CRC coder 237.

Record data is first converted into a data string satisfying a constraint condition by an RLL coder 236 by way of the CRC coder 237 within the hard disk controller 203. Then it is added a parity string to the data string by the ECC coder 235.

Then in the read channel 202, the record data is sent out to the preamplifier 201 by way of the record compensator 228 and driver 227. The record compensator 228 performs a compensation process for widening a reversing interval a little in a place where a magnetization reversal adjoins. The preamplifier 201 lets the driver 212 generate a write current for a recording head.

Comparably, when reproducing data, an analog voltage from a reproducing head is amplified by the amplifier 211 of the preamplifier 201, followed by being output to the read channel 202 as an analog signal. In the read channel 202, a thermal asperity detection process is applied to the analog signal by the TA detector 221, followed by being converted into a digital signal by way of the VGA 222, LFP 223 and ADC 224. Then, a waveform equalization is applied by the FIR filter 225, followed by a bit string being generated by the detector 226.

Then, the generated bit string is returned to the hard disk controller 203 and once stored in the data storage unit 231, followed by the ECC decoder 232 carrying out an error correction. Then, it is output as a reproduction data by way of the RLL decoder 233 and CRC decoder 234.

Figure 3:
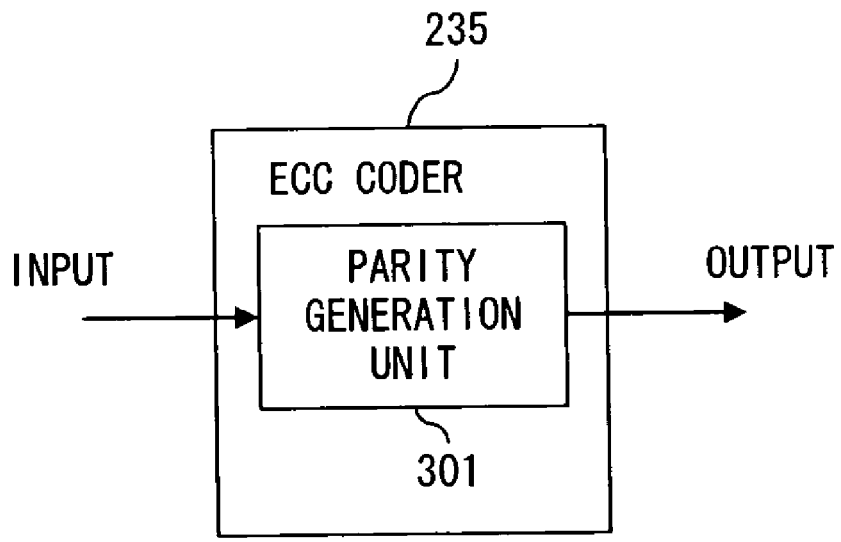
FIG. 3 is a configuration diagram of an ECC coder.

FIG. 3 exemplifies a configuration of the ECC coder 235 shown in FIG. 2B. The ECC coder 235 includes a parity generation unit 301 which generates a parity string from a bit string of record data by using a generator polynomial. A generator polynomial of a Reed Solomon code of the number of error corrections of t can generally be described in the following expression:

$$G(x)=(x-\alpha)(x-\alpha^2)\ldots(x-\alpha^{2t}) \quad (7)$$

Therefore, in the case of t=20, a generator polynomial of the 40th degree is usually used as follows:

$$G(x)=(x-\alpha)(x-\alpha^2)\ldots(x-\alpha^{40}) \quad (8)$$

Comparably, the present embodiment is configured to use a generator polynomial of the 41st degree, as follows, by increasing the degree of a generator polynomial by one in order to judge a success or failure of a decoding early:

$$G(x)=(x-\alpha)(x-\alpha^2)\ldots(x-\alpha^{40})(x-\alpha^{41}) \quad (9)$$

Figure 4:
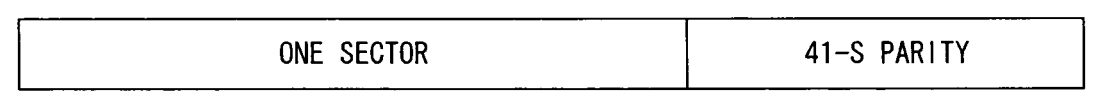

Because of this, a 41-symbol parity string is generated and inserted in front of one sector bit string as shown in FIG. 4. Here, the assumption is, for example, a Galois field $GF(2^{10})$ is used for a coding, one sector comprises 410 symbols and one symbol comprises 10 bits.

FIG. 5 exemplifies a configuration of the ECC decoder 232 shown in FIG. 2B. The ECC decoder 232 comprises a syndrome calculation unit 501, a syndrome storage unit 502, a syndrome update unit 503, an error locator polynomial calculation unit 504, a comparison unit 505, a Chien search execution unit 506, a judgment unit 507 and an error value calculation unit 508.

A plurality of decoding candidates sent out from the read channel 202 are stored in the data storage unit 231 and then input to the ECC decoder 232 one by one. The ECC decoder 232 applies a decoding process to the first candidate data string by the following procedure:

Step 1: the syndrome calculation unit 501 calculates a syndrome polynomial (i.e., coefficients of the polynomial) of the data string and outputs the syndrome polynomial to the error locator polynomial calculation unit 504. In this event, values of 2t+1 pieces of syndromes $s_i$ (where i=1, 2, ..., 2t, 2t+1) are calculated. Also, the syndrome calculation unit 501 stores the syndrome polynomial in the syndrome storage unit 502 in order to use it for the decoding process for the second candidate and thereafter.

Step 2: the error locator polynomial calculation unit 504 calculates an error locator polynomial from the syndrome polynomial by a Berlekamp Massey method.

In the Berlekamp Massey method, a repeated updates of a polynomial, starting from the initial value of the polynomial, by the number of times which is the same as the degree of the generator polynomial usually calculates an error locator polynomial. In order to calculate the i-th place polynomial $C_i(x)$ in this event, a value of the i-th syndrome $s_i$ is required.

The error locator polynomial calculation unit 504 outputs the 2t-th place polynomial $C_{2t}(x)$ and the 2t+1-th place polynomial $C_{2t+1}(x)$ to the comparison unit 505 along with the data string.

Step 3: the comparison unit 505 compares coefficients of the polynomials $C_{2t}(x)$ and $C_{2t+1}(x)$, thereby checking whether or not the two polynomials are identical.

According to a characteristic of the Berlekamp Massey method, if the number of errors included in a data string is k pieces (where k≦t), a polynomial is not updated by the 2k+1-th repetition and thereafter, and therefore all the polynomials starting $C_{2k}(x)$ and thereafter become the same. Therefore, if the polynomials $C_{2t}(x)$ and $C_{2t+1}(x)$ are identical, the number of errors is at most t pieces, making it apparently within a range of an error correction capability. Contrarily, if the $C_{2t}(x)$ and $C_{2t+1}(x)$ are not identical, the number of errors exceeds the error correction capability.

Accordingly, if the $C_{2t}(x)$ and $C_{2t+1}(x)$ are identical, the comparison unit 505 judges that a correction of the candidate succeeds, and outputs the data string, syndrome polynomial, error locator polynomial and judgment result to the Chien search execution unit 506. Contrarily, if the $C_{2t}(x)$ and $C_{2t+1}(x)$ are not identical, the comparison unit 505 judges that a correction of the candidate fails, and instructs the data storage unit 231 to output the next decoding candidate.

As described above, the addition of one symbol parity redundantly to the data string makes it possible to calculate a polynomial of the Berlekamp Massey method redundantly by one, thereby enabling a detection of a correction failure of the data string during a decoding. Note that a format redundantly adding several symbols of parity may be used instead.

Step 4: the Chien search execution unit 506 carries out a Chien search by using the error locator polynomial C(x) and calculates values of $C(\alpha^j)$ for all the positions j on the data string, followed by outputting the data string, syndrome polynomial, error locator polynomial and the calculation result of the $C(\alpha^j)$ to the judgment unit 507. Here, a position j indicating $C(\alpha^j)=0$ is the error position.

Step 5: the judgment unit 507 judges a success or failure of the correction by using the syndrome polynomial and the calculation result of $C(\alpha^j)$ and outputs the information received from the Chien search execution unit 506 and the judgment result to the error value calculation unit 508 if the judgment is that the correction succeeds. Contrarily, if the judgment is a correction failure, it instructs the data storage unit 231 to output the next decoding candidate.

Step 6: the error value calculation unit 508 corrects an erroneous value at the error position to the correct value based on a prescribed algorithm by using the syndrome polynomial and error locator polynomial, followed by eliminating a parity string from the corrected data string and outputting the resultant data string to the RLL decoder 233 at a later stage.

Therefore, if the correction for the first candidate succeeds, the error corrected data string is output from the ECC decoder 232. If the correction fails, requiring a decoding of the second candidate, or thereafter, a decoding process is carried out by using information stored in the syndrome storage unit 502.

In this case, the syndrome update unit 503 compares the candidate for a decoding target with the first candidate stored in the syndrome storage unit 502, extracts a different symbol and updates the syndrome polynomial stored in the syndrome storage unit 502, in the step 1. Then it outputs the updated syndrome polynomial to the error locator polynomial calculation unit 504. Processes for the step 2 and thereafter are the same as the case of the above described first candidate.

As described above, the ECC decoder 232 shown in FIG. 5 is capable of simplifying a calculation of a syndrome polynomial for the second candidate and thereafter and eliminating a Chien search in the case of the comparison unit 505 judging a correction failure, thereby greatly reducing a calculation volume. Also eliminated is an error correction in the case of the judgment unit 507 judging a correction failure, thereby further eliminating the calculation volume.

For example, comparing the first candidate comprising n+1 symbols with the decoding target candidate as shown in FIG. 6, the symbol at the position of j=1 of the first candidate is $\alpha^{12}$ while the symbol at the same position of the decoding target candidate is $\alpha^6$, and therefore their values are apparently different. In this case, the reception word polynomials Y1(x) and Y(x) of the first candidate and decoding target candidate, respectively, are as follows:

$$Y1(x) = \alpha^2 x^n + \alpha^{22} x^{n-1} + \ldots + \alpha^{12} x + \alpha^5 \tag{10}$$

$$Y(x) = \alpha^2 x^n + \alpha^{22} x^{n-1} + \ldots + \alpha^6 x + \alpha^5 \tag{11}$$

And the syndrome polynomials S1(x) and S(x) of the first candidate and decoding target candidate, respectively, are as follows:

$$S1(x) = s1_1 + s1_2 x + \ldots + s1_{2t} x^{2t-1} + s1_{2t+1} x^{2t}$$

$$s1_i = Y1(\alpha^i); \text{ (where } i=1, 2, \ldots, 2t, 2t+1) \tag{12}$$

$$S(x) = s_1 + s_2 x + \ldots + s_{2t} x^{2t-1} + s_{2t+1} x^{2t}$$

$$s_i = Y(\alpha^i); \text{ (where } i=1, 2, \ldots, 2t, 2t+1) \tag{13}$$

where the $s1_i$ represents the i-th syndrome of the first candidate, the $s_i$ represents the i-th syndrome of the decoding target candidate. In this event, the $s_i$ can be expressed by using the $s1_i$ as the following expression:

$$\begin{aligned} s_i &= s1_i + Y(\alpha^i) - Y1(\alpha^i) \\ &= s1_i + (\alpha^6 - \alpha^{12})\alpha^i \end{aligned} \tag{14}$$

The expression (14) indicates that an addition of a product of the change amount ($\alpha^6 - \alpha^2$) and $\alpha^i$ to a value of the $s1_i$ stored in the syndrome storage unit 502 obtains a value of the updated syndrome $s_i$.

Meanwhile, in the case of values of a plurality of symbols being different, it is possible to calculate the updated syndrome $s_i$ in the same way as the expression (14). In such a case, the difference of syndromes $Y(\alpha^i) - Y1(\alpha^i)$ is a result of adding the product of a change amount of a symbol value and $(\alpha^i)^j$ for all positions j where symbol values are different.

The polynomials $C_1(x)$ through $C_{2t+1}(x)$ are sequentially calculated according to the Berlekamp Massey method by using the thusly updated syndromes $s_i$. In the case of t=20, the polynomials $C_1(x)$, $C_{40}(x)$ and $C_{41}(x)$ are for example as follows:

$$C_1(x) = 1 + \alpha x$$

$$C_{40}(x) = 1 + x + \alpha^2 x^2 + \ldots + \alpha^{35} x^{20}$$

$$C_{41}(x) = 1 + \alpha x + \alpha^{50} x^3 + \ldots + \alpha^{100} x^{20} \tag{15}$$

In this case, the $C_{40}(x)$ and $C_{41}(x)$ are not identical and therefore a correction of the decoding target candidate is judged to fail, proceeding to a decoding of the next candidate.

The next is a further detailed description of a decoding process carried out by the ECC decoder 232 shown in FIG. 5 by referring to FIGS. 7 through 10.

Figure 7:
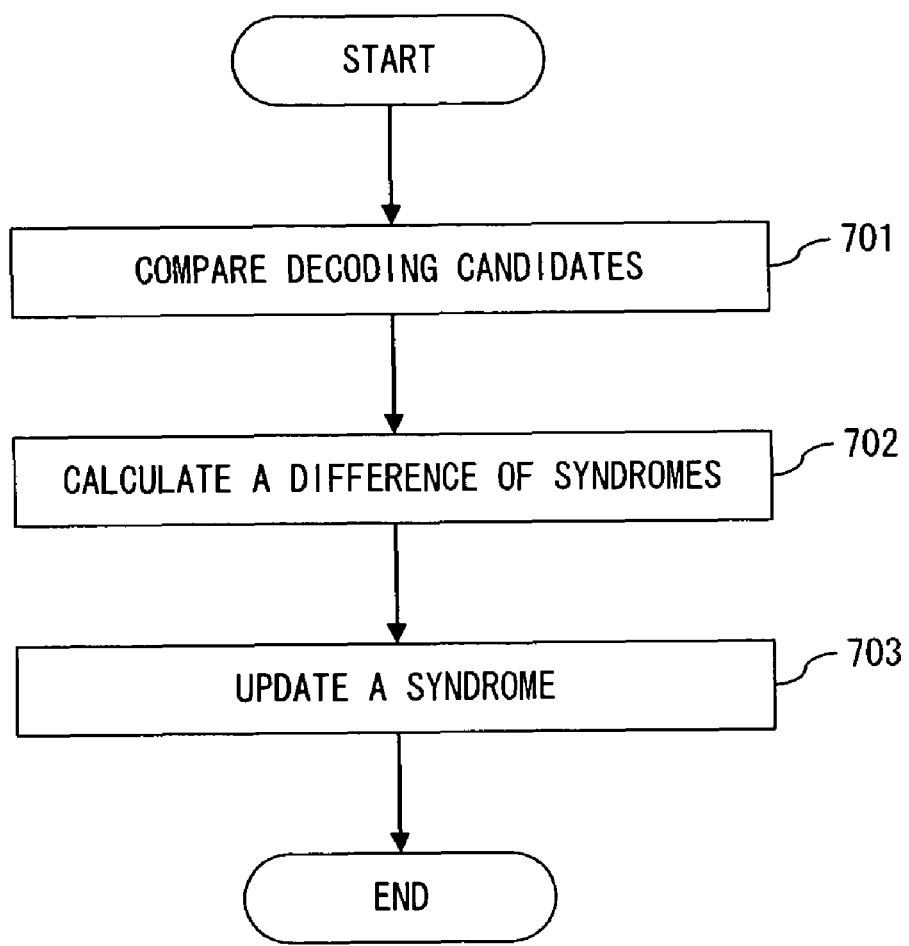
FIG. 7 is a flow chart of a process at a syndrome update unit.

FIG. 7 is a flow chart of a process at the syndrome update unit 503. The syndrome update unit 503 first compares data strings of a decoding target candidate and the candidate stored in the syndrome storage unit 502 and extracts values of different symbols from the respective candidates (step 701).

Then, as to all positions j where the symbols are different, it calculates a sum of products of change amounts of symbols and the $(\alpha^i)^j$ and determines the resultant value as the syndrome difference $Y(\alpha^i) - Y1(\alpha^i)$ (step 702). Then it adds the difference to the syndrome stored in the syndrome storage unit 502, thereby updating the syndrome (step 703).

Figure 8:
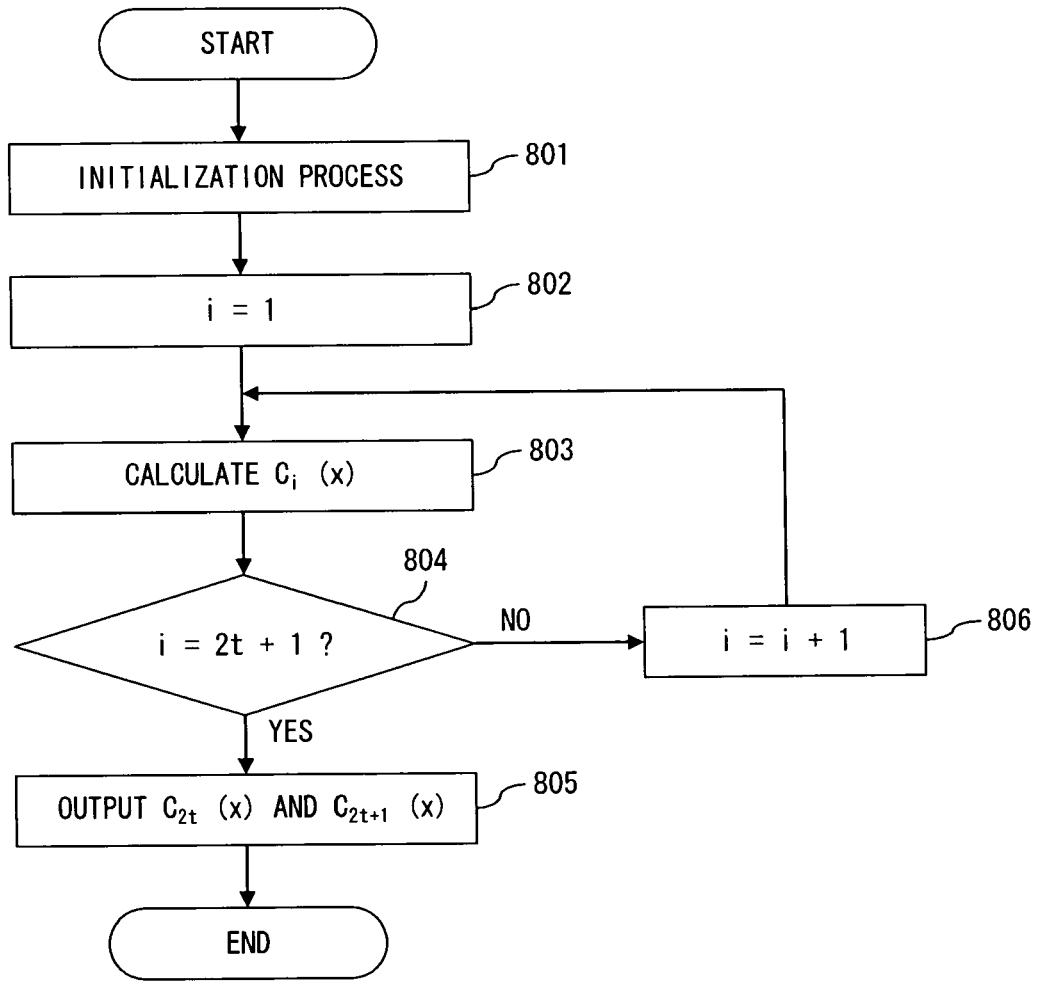
FIG. 8 is a flow chart of a process at an error locator polynomial calculation unit.

FIG. 8 is a flow chart of a process at the error locator polynomial calculation unit 504. The error locator polynomial calculation unit 504 first performs an initialization process so as to set polynomials $C_0(x)$ and B(x), integers a, b and L as follows (step 801):

$$C_0(x) = 1$$

$$B(x) = 1$$

$$a = 1$$

$$b = 1$$

$$L = 0$$

Then, it sets a control variable i for indicating the number of repetitions to "1" (step 802). Then it calculates coefficients of the i-th polynomial $C_i(x)$ from those of the (i−1)-th polynomial $C_{i-1}(x)$ according to the Berlekamp Massey method by using the value of the syndrome $s_i$ (step 803). In this event, the coefficients of the polynomial $C_i(x)$ is calculated, with the coefficients of the term of the j-th degree of the polynomial $C_{i-1}(x)$ being $c_j$ (where j=1, 2, ..., L), according to the following algorithm:

1) compute $$d = s_i + \sum_{j=1}^{L} c_j s_{i-j}$$

2) If $d = 0$, then $C_{i-1}(x) \rightarrow C_i(x)$ $a + 1 \rightarrow a$

3) If $d \neq 0$ and $2L > i - 1$, then $C_{i-1}(x) - db^{-1} x^a B(x) \rightarrow C_i(x)$ $a + 1 \rightarrow a$ 4) If $d \neq 0$ and $2L \leq i - 1$, then $C_{i-1}(x) - db^{-1} x^a B(x) \rightarrow C_i(x)$ $i - L \rightarrow L$ $C_{i-1}(x) \rightarrow B(x)$ $d \rightarrow b$ $1 \rightarrow a$ Then it compares i with the degree of the generator polynomial 2t+1 (step 804). If i<2t+1, putting i=i+1 (step 806) and it repeats the calculation of the step 803. Then, when i reaches 2t+1, it outputs the coefficients of polynomials $C_{2t}(x)$ and $C_{2t+1}(x)$ to the comparison unit 505 (step 805).

Figure 9:
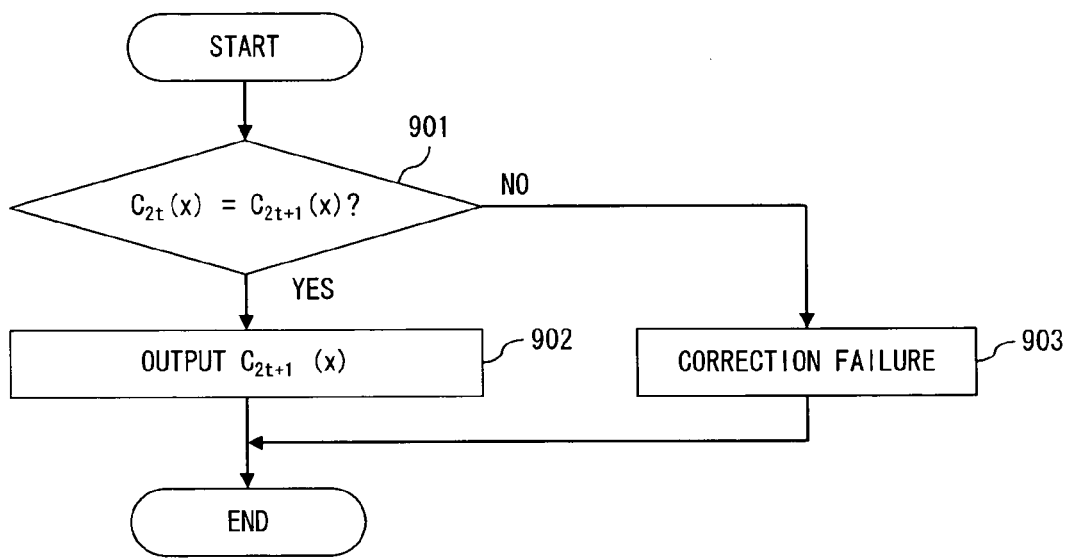
FIG. 9 is a flow chart of a process at a comparison unit.

FIG. 9 is a flow chart of a process at the comparison unit 505. The comparison unit 505 first compares each coefficient of the polynomial $C_{2t}(x)$ with that of the polynomial $C_{2t+1}(x)$ (step 901) and, if all the coefficients are identical, outputs the coefficients of the polynomial $C_{2t+1}(x)$ to the Chien search execution unit 506 as coefficients of an error locator polynomial (step 902). If either coefficient is not identical, judging a correction failure, it requests the data storage unit 231 for the next candidate (step 903).

FIG. 10 is a flow chart of a process at the judgment unit 507. The judgment unit 507 first checks a value of each syndrome $s_i$ (where i=1, 2, ..., 2t, 2t+1) (step 1001) and, if all the syndromes $s_i$ are "0", judges that a correction is not necessary and outputs the judgment result to the error value calculation unit 508 (step 1003).

If either of the syndromes $s_i$ is not "0", it then checks a value of each of $C(\alpha^j)$ (where j=0, 1, . . . , n) (step 1002) and, if there is a position where $C(\alpha^j)=0$, then outputs the corresponding position j to the error value calculation unit 508 as the error position (step 1004). If all the $C(\alpha^j)$ are non-zero, it judges a correction failure and requests the data storage unit 231 for the next candidate (step 1005).

The description is provided for an error correction at a magnetic disk apparatus in the above described embodiment, the present invention, however, can be applied to storage products, such as an optical disk apparatus, and to reception apparatuses for use in a telecommunication system. The present invention can also be applied to a BCH code.

Meanwhile, the ECC coder and ECC decoder can be accomplished not only by hardware but also by software. In the case of accomplishing them by software, an information processing apparatus (e.g., a computer) as shown by FIG. 11 is used.

Figure 11:
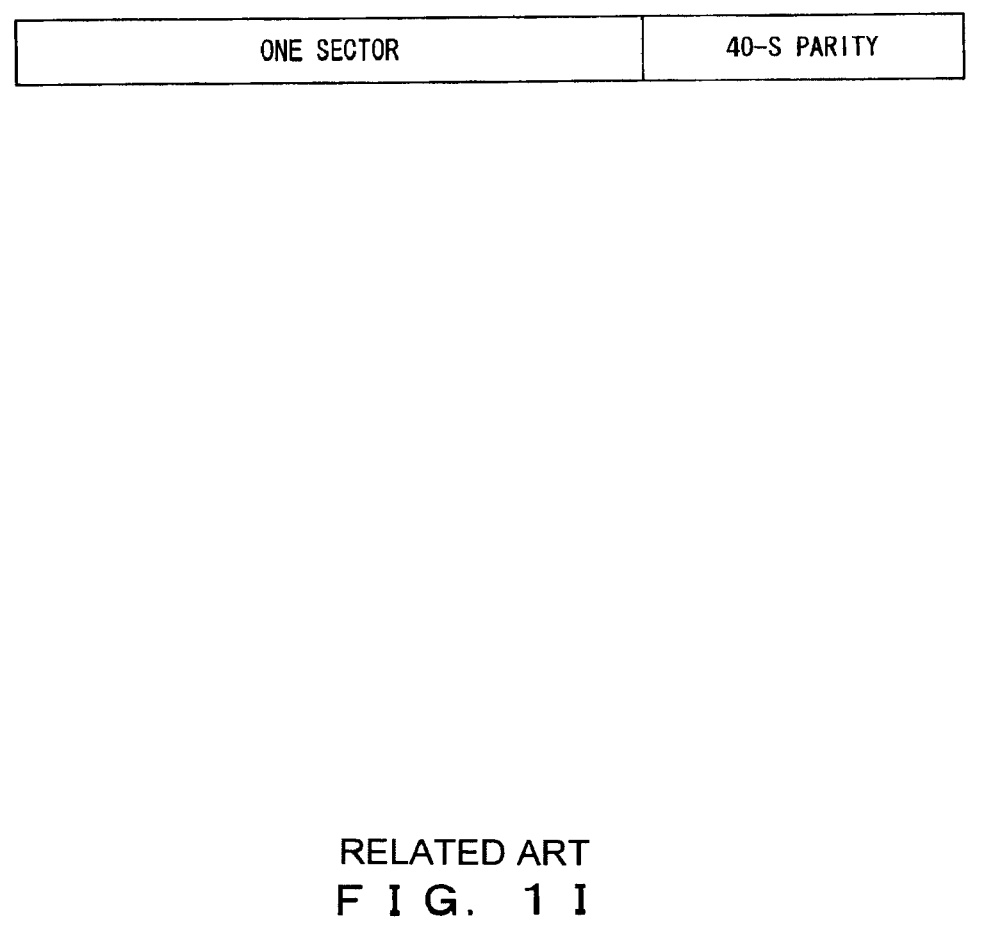

The information processing apparatus shown by FIG. 11 comprises a central processing unit (CPU) 1101, memory 1102, an input apparatus 1103, an output apparatus 1104, an external storage apparatus 1105, a media drive apparatus 1106, a network connection apparatus 1107 and a bus 1108 interconnecting the aforementioned components.

The memory 1102, including read only memory (ROM), random access memory (RAM), et cetera, stores a program and data which are used for processes. The CPU 1101 executes the program by utilizing the memory 1102, thereby carrying out the coding process and decoding process.

The memory 1102 stores coefficients of the generator polynomial, syndrome polynomial and error locator polynomial, data strings of decoding candidates, error-corrected data strings, et cetera, as process target or process result data. In this case, the memory 1102 functions as the data storage unit 231 and syndrome storage unit 502 which are shown in FIG. 5.

The parity generation unit 301 shown in FIG. 3, and the syndrome calculation unit 501, syndrome update unit 503, error locator polynomial calculation unit 504, comparison unit 505, Chien search execution unit 506, judgment unit 507, error value calculation unit 508, all shown in FIG. 5, correspond to the program stored in the memory 1102.

The input apparatus 1103, comprehending a key board, a pointing device, et cetera for example, is used for inputting a user instruction and information. The output apparatus 1104, comprehending a display, a printer, a speaker, et cetera for example, is used for outputting an inquiry and a process result to the user.

The external storage apparatus 1105 comprehends a magnetic disk apparatus, an optical disk apparatus, a magneto optical disk apparatus, a tape apparatus, et cetera for example. The information processing apparatus stores the program and data in the external storage apparatus 1105 and use them by loading them onto the memory 1102 on an as required basis.

The media drive apparatus 1106 drives a portable recording medium 1109 for accessing the record contents. The portable recording medium 1109 is a discretionary computer readable recording medium such as memory card, flexible disk, optical disk, magneto optical disk. The user stores the program and data in the portable recording medium 1109 and uses them by loading them onto the memory 1102 on an as required basis.

The network connection apparatus 1107 is disposed for carrying out a data conversion associated with a telecommunication by being connected to a discretionary telecommunication network such as a local area network (LAN). The information processing apparatus receives the program and data from an external apparatus by way of the network connection apparatus 1107 and uses them by loading them onto the memory 1102 on an as required basis.

What is claimed is:

1. An error correction apparatus correcting an error of a data string by using a Reed Solomon code or a Bose Chaudhuri Hocquenghem code with t as the number of error corrections, comprising:
    a data storage device configured to store a plurality of data strings respectively including at least 2t+1 pieces of symbols as a parity string;
    a syndrome calculation device configured to calculate one set of syndromes from a first data string from among the plurality of data strings;
    an error locator polynomial calculation device configured to calculate coefficients of an error locator polynomial from the one set of syndromes;
    a judgment device configured to judge whether or not a correction succeeds by using the coefficients of the error locator polynomial, and to request the data storage device for a second data string if the correction is judged to fail, while outputting a judgment result of a successful correction if the correction is judged to succeed; and
    a correction device configured to correct an error of the first data string by using the one set of syndromes and the coefficients of the error locator polynomial when receiving the judgment result of the successful correction.

2. The error correction apparatus according to claim 1, wherein
    said error locator polynomial calculation device repeats a calculation for obtaining coefficients of an i-th polynomial of a plurality of polynomials from coefficients of an (i−1)-th polynomial of the plurality of polynomials according to a Berlekamp Massey method by using i-th syndrome, while said judgment device compares coefficients of a (2t+1)-th polynomial of the plurality of polynomials with coefficients of a 2t-th polynomial of the plurality of polynomials and judges a correction failure if the coefficients of the (2t+1)-th polynomial are not identical with the coefficients of the 2t-th polynomial.

3. The error correction apparatus according to claim 1, wherein
    said correction device includes a Chien search execution device configured to search for an error position of said first data string by using said error locator polynomial when receiving said judgment result of said successful correction, and an error value calculation device configured to calculate a correct value of the searched error position.

4. The error correction apparatus according to claim 3, wherein
    said correction device further includes a judgment device configured to request said data storage device for said second data string by judging a correction failure if at least one syndrome of said one set of syndromes is non-zero and if an error position is not found by said Chien search execution device.

5. The error correction apparatus according to claim 1, further comprising
    a syndrome storage device configured to store said one set of syndromes and a syndrome update device configured to calculate a difference of each syndrome from a difference between said first and second data strings, to update the one set of syndromes by adding the obtained difference to each syndrome included in the one set of syndromes and to output the updated set of syndromes as one set of syndromes of the second data string.

6. The error correction apparatus according to claim 1, further comprising a coding device configured to generate a parity string comprising at least 2t+1 pieces of symbols by using a given information string and coefficients of a generator polynomial and to generate a data string by adding the parity string to the given information string.

7. An information storage apparatus equipped with an error correction apparatus correcting an error of a data string by using a Reed Solomon code or Bose Chaudhuri Hocquenghem code with t as the number of error corrections, wherein the correction apparatus comprises a data storage device configured to store a plurality of data strings respectively including at least 2t+1 pieces of symbols as a parity string;

a syndrome calculation device configured to calculate one set of syndromes from a first data string from among the plurality of data strings;

an error locator polynomial calculation device configured to calculate coefficients of an error locator polynomial from the one set of the syndromes;

a judgment device configured to judge whether or not a correction succeeds by using the coefficients of the error locator polynomial, and to request the data storage device for a second data string if the correction is judged to fail, while outputting a judgment result of a successful correction if the correction is judged to succeed; and a correction device configured to correct an error of the first data string by using the one set of syndromes and the coefficients of the error locator polynomial when receiving the judgment result of the successful correction.

* * * * *